United States Patent
Asghari et al.

(10) Patent No.: US 9,442,165 B2
(45) Date of Patent: Sep. 13, 2016

(54) METHOD FOR ESTIMATING BATTERY LIFE IN PRESENCE OF PARTIAL CHARGE AND DISCHARGE CYCLES

(71) Applicant: NEC Laboratories America, Inc., Princeton, NJ (US)

(72) Inventors: Babak Asghari, San Jose, CA (US); Ratnesh Sharma, Fremont, CA (US)

(73) Assignee: NEC Corporation (JP)

( * ) Notice: Subject to any disclaimer, the term of this patent is extended or adjusted under 35 U.S.C. 154(b) by 450 days.

(21) Appl. No.: 14/134,197

(22) Filed: Dec. 19, 2013

(65) Prior Publication Data

US 2014/0139191 A1     May 22, 2014

Related U.S. Application Data

(63) Continuation-in-part of application No. 13/543,818, filed on Jul. 7, 2012, now Pat. No. 9,020,649.

(60) Provisional application No. 61/739,275, filed on Dec. 19, 2012.

(51) Int. Cl.

| | |
|---|---|
| *H02J 7/00* | (2006.01) |
| *G01R 31/36* | (2006.01) |
| *H02J 3/38* | (2006.01) |
| *H02J 7/34* | (2006.01) |
| *H02J 9/00* | (2006.01) |
| *H01M 10/48* | (2006.01) |
| *H02J 3/14* | (2006.01) |
| *H01M 10/44* | (2006.01) |
| *H01M 10/42* | (2006.01) |

(52) U.S. Cl.
CPC .......... *G01R 31/3648* (2013.01); *H01M 10/48* (2013.01); *H02J 3/381* (2013.01); *H02J 3/383* (2013.01); *H02J 3/386* (2013.01); *H02J 7/34* (2013.01); *H02J 9/00* (2013.01); *G01R 31/3679* (2013.01); *H01M 10/44* (2013.01); *H01M 2010/4278* (2013.01); *H02J 2003/146* (2013.01); *Y02E 10/563* (2013.01); *Y02E 10/763* (2013.01); *Y02P 80/14* (2015.11)

(58) Field of Classification Search
CPC ...................... G06F 19/34688; G06F 19/3406; G06F 1/3212; G06F 1/325; H01M 10/121; H01M 10/4257; H01M 2010/4271; H01M 2010/4278; H02J 7/00
USPC .......... 702/63, 1, 64, 66; 320/132, 134, 152, 320/164, 150, 106, 111, 126, 128, 136; 700/283
See application file for complete search history.

(56) References Cited

U.S. PATENT DOCUMENTS

| | | | | |
|---|---|---|---|---|
| 5,825,156 A | * | 10/1998 | Patillon | ................. H02J 7/0077 702/63 |
| 5,936,385 A | * | 8/1999 | Patillon | .............. G01R 31/3651 320/130 |
| 6,985,799 B2 | * | 1/2006 | Zalesski | ................. H02J 1/102 700/286 |

(Continued)

*Primary Examiner* — Kenneth M Lo
*Assistant Examiner* — Derrick Boateng
(74) *Attorney, Agent, or Firm* — Joseph Kolodka

(57) ABSTRACT

A management framework is disclosed that achieves maximum energy storage device lifetime based on energy storage device life estimation and the price of energy. The management framework includes a battery life estimation from a supercycle model, for a time window between two consecutive full charges of a battery, which allows assessing a worst case scenario impact of all partial cycles within a supercycle on the battery life. The battery life estimation then considers each supercycle as a single discharge unit instead of treating each individual discharge period separately.

14 Claims, 6 Drawing Sheets

(56) References Cited

U.S. PATENT DOCUMENTS

| | | | | |
|---|---|---|---|---|
| 7,157,803 B2* | 1/2007 | Meyers | ................ | H02J 9/06 290/1 A |
| 8,890,480 B2* | 11/2014 | Vian | ................ | G01R 31/3651 320/111 |
| 2004/0158360 A1* | 8/2004 | Garland, II | ............ | G06Q 50/06 700/286 |
| 2004/0189091 A1* | 9/2004 | Algrain | ................ | F01M 5/02 307/10.1 |
| 2012/0053837 A1* | 3/2012 | Viassolo | ................ | F03D 9/021 702/1 |

* cited by examiner

METHOD FOR ESTIMATING BATTERY LIFE IN PRESENCE OF PARTIAL CHARGE AND DISCHARGE CYCLES

This application claims priority to Provisional Application Ser. No. 61/739,275 filed Dec. 19, 2012, and is a continuation-in-part of application Ser. No. 13/543,818, entitled "Method for Real-Time Power Management of a Grid-tied Microgrid to Extend Storage Lifetime and Reduce Cost of Energy", filed Jul. 12, 2012, the contents of both which are incorporated herein by reference.

BACKGROUND

The present invention relates to power management for microgrids and more particularly to estimating battery life in the presence of partial charge and discharge cycles.

Microgrid is an emerging technology which promises to achieve many simultaneous goals for power system stakeholders, from generator to consumer. Its framework offers a mean to capitalize on diverse energy sources in a decentralized way, while reducing the burden on the grid by generating power close to the consumer. Since microgrid with distributed generation (DG) systems fall within city load centers (<69 kVA) at electric utility substations, near feeders, within neighborhoods, and at industrial, commercial, and residential customer locations [2], storage devices such as battery are necessary to: Manage electric grid peak demand, Improve reliability and outage mitigation, compensate for intermittent power generation from DGs, Provide ancillary services specifically in islanded mode of operation, and Increase electric grid load factor and utilization via the smart grid.

As a result, storage devices are immediate components of microgrids as a mean to achieve high penetration of intermittent renewable energy resources into the grid. The desired size of the energy storage device for distributed energy storage systems (DESS) application is 25-200 kW 1-phase and 25-75 kW 3-phase while its duration and desired lifetime are 2-4 hours and 10-15 years, respectively. The desired values in the case of commercial and industrial (C&I) energy management are 50-1000 kW in size, 3-4 hours duration, and 15 years lifetime [2]. Based on these facts, different battery technologies, such as Lithium-Ion batteries, can be promising candidate for these applications.

The available power from renewable energy components, particularly wind turbine, is highly variable and somewhat random. Consequently, batteries in hybrid power systems, whether in DESS or C&I energy management applications, experience a very irregular pattern of charge and discharge cycles. On the other hand, it is well-known that battery life depends on discharge pattern. Therefore, managing discharge pattern is a promising approach to battery life maximization. Since one can say that maximum battery lifetime can be achieved (i.e. the nominated lifetime) when it always kept idle, there should be a rational definition for maximum lifetime of the battery. In this research, this term is defined as the maximum possible battery lifetime by taking the cost of energy in to consideration at each time step of management. In other words, the maximum battery lifetime is beneficial as long as the cost of the energy provided for the customer is minimum at the time of management.

While storage provides necessary buffer to support the intermittency and unreliability of renewable and other stochastic generation, it is also the most expensive element of the microgrid. This demands real-time power management to guarantee the maximum possible storage lifetime based on the final cost of energy.

In the conventional battery life estimation method it is assumed that life estimation is carried out at the end of each discharge event when depth of discharges DoDs and battery discharge currents for all previous discharge events are known. However in a real-time power management system based on battery life regulation, the life of battery should be estimated at each management time-step even during an ongoing discharge event. This requires to continuously update the information related to the last discharge event in the life estimation block.

Furthermore, the battery cycle life versus depth of discharge DOD data published by the manufactures usually assume that the battery is fully charged before each discharge event. This might not be the case in MicroGrid MG applications where battery experiences many partial charges during its operation. The deteriorating impact of consecutive partial charge cycles on the battery life is well-known but normally not available from battery specification sheets.

Previous attempts have used experimental data to build estimation models which include the impact of partial cycles on battery life.

SUMMARY

In one aspect, a management framework to achieve maximum battery lifetime based on battery life estimation and the price of energy.

In another aspect, a computer implemented method for estimating battery life in power management of a microgrid with an energy storage device that includes charging and discharging modes, includes receiving power data from different generation sources, storage state of charge and the storage discharge pattern, estimating the storage lifetime and determining cost of energy from the energy storage device which includes estimating battery life that considers a supercycle (SC) of a battery as a single discharge unit instead of treating each individual discharge period separately, the supercycle defines a time window between two consecutive full charges of a battery which allows assessing a worst case scenario impact of all partial cycles within a supercycle on the battery life, and allocating desired power between the energy storage device and a power grid to minimize cost of energy through reduced grid power or feed-in-tariff while maximizing storage lifetime based on a final energy cost.

In yet another aspect, a system for estimating battery life in power management of a microgrid with an energy storage device that includes charging and discharging modes, includes different generation sources, storage state of charge and the storage discharge pattern providing power data, and a computer configured for estimating the storage lifetime and determining cost of energy from the energy storage device which includes estimating battery life that considers a supercycle (SC) of a battery as a single discharge unit instead of treating each individual discharge period separately, the supercycle defines a time window between two consecutive full charges of a battery which allows assessing a worst case scenario impact of all partial cycles within a supercycle on the battery life. The computer allocates desired power between the energy storage device and a power grid to minimize cost of energy through reduced grid power or feed-in-tariff while maximizing storage lifetime based on a final energy cost.

DESCRIPTION

The invention is directed to a supercycle (SC) that is defined as a time window between two consecutive full charges of a battery, which allows assessing a worst case scenario impact of all partial cycles within a supercycle SC on the battery life. The battery life estimation then considers each supercycle as a single discharge unit instead of treating each individual discharge period separately. The invention provides more accurate estimation of battery life compared to prior techniques.

Figure 1A:
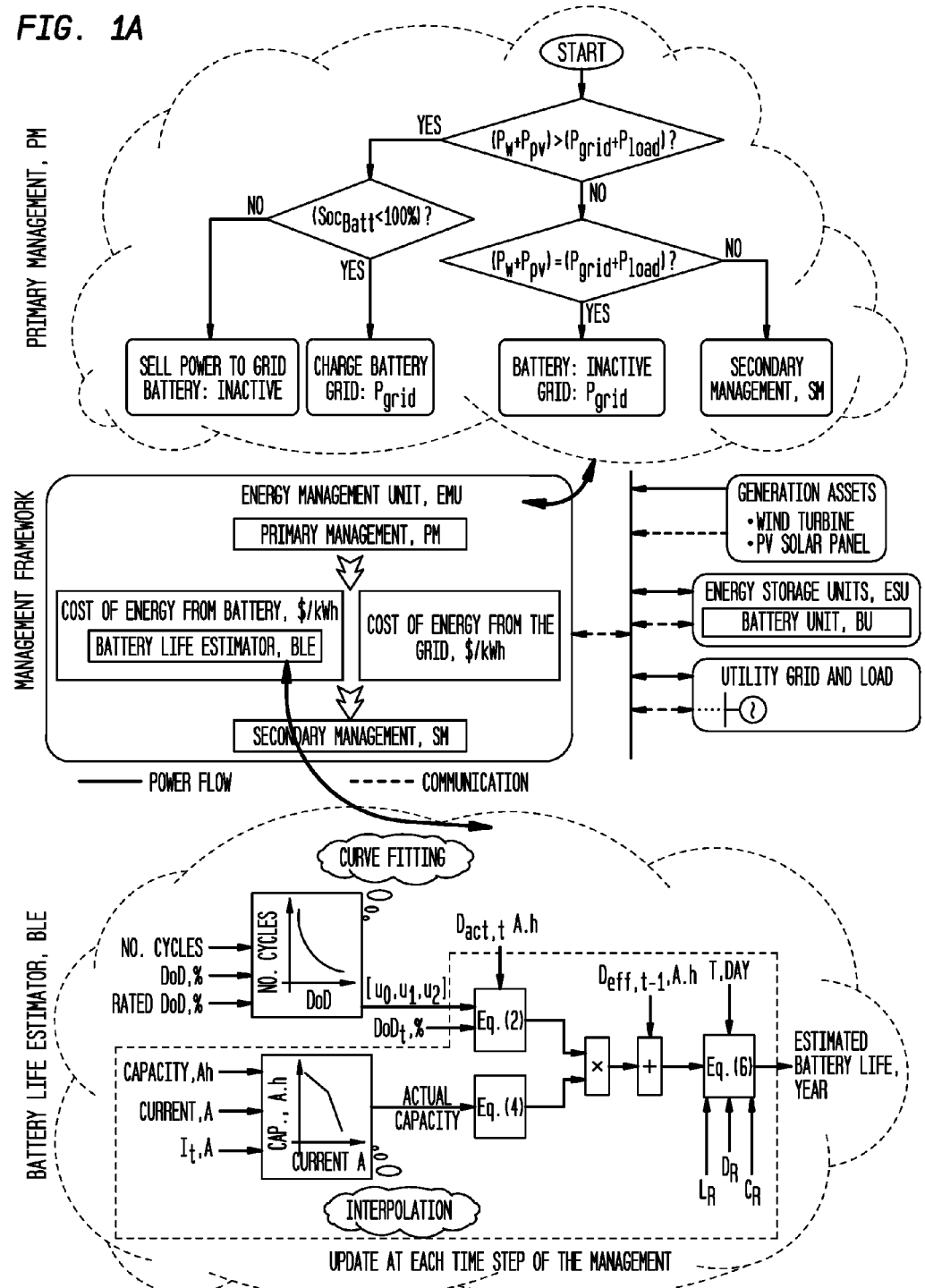
FIG. 1A shows an exemplary system with power management units.

FIG. 1A shows an exemplary system with power management units. In FIG. 1A, a management frame work 10 controls a primary management (PM) system 20 and a battery life estimator (BLE) 30. Batteries are usually equipped with battery management system (BMS) which is defined as any electronic device that manages a rechargeable battery (cell or battery pack), by monitoring its state, calculating secondary data, reporting that data, protecting it, controlling its environment, and/or balancing it. However, there is no real-time supervisory power management system on the top level of microgrid to regulate battery discharge in order to maximize its lifetime. While battery is usually the most expensive part of such systems at the time of installation, and needs frequent replacement despite other components, a real-time power management seems tremendously helpful to guarantee the appropriate use of battery. Generally, real-time management strategy performs at a smaller time interval, e.g., every few seconds or minute. Results of such systems are the power share between different generation and storage assets.

In one hand, real-time management operates on existing system with certain amount of DG resources and storage devices. On the other hand, it is well known that power from PV and wind is almost free after installation because of no fuel cost. Thus, it is beneficial to capture all available power from wind and PV. Therefore, the real-time management problem is reduced to power sharing between battery and grid. Grid power is available from the grid at time-of-use rates, and is limited to a maximum of 40 kW. The reason could be a weak distribution system, lack of enough generation, and/or low capacity of different equipment such as overhead lines and/or transformer. As mentioned earlier, the purchased power from the grid is scheduled a day ahead as unit commitment problem. In this study, the authors are not dealing with the unit commitment problem. Therefore, the scheduled power from the grid is considered as a known input parameter in to the management system. The battery will be charged only in the case of excess power from PV and wind. In other words, battery will not be charged by the power purchased from the grid.

Replacement cost is the most effective factor in the CEB calculation. Based on the discharge pattern, batteries need to be replaced periodically to maintain system performance. Therefore, it can be concluded that the CEB depends on battery aging which directly depends on discharge pattern. As a result, the power management should decide upon the discharge pattern and the associated lifetime and cost. Since maximum possible life of the battery occurs when battery is kept idle (which is not reasonable), there should be a competing objective. final cost of energy is considered as the competing objective in this paper. The general schematic block-diagram of the energy management unit (EMU) with different components of grid-tied system is shown in FIG. 1. In order to calculate the cost of energy from the battery, it is anticipated to calculate the number of its replacements during the lifetime of the project. As a result, it is required to estimate the battery lifetime based on the discharge pattern up to the point of management. Therefore, the management strategy starts with the battery lifetime estimation, which is shown as Battery Life Estimator (BLE) unit. Consequently, the CEB will be estimated, in $/kWh. Eventually, the decisions will be made based on the defined secondary management (SM) strategy between battery and grid. Any scenario, such as the ones defined in this study or heuristic optimization, can be defined as SM block for battery discharging.

Since the overall management system is responsible for both charging and discharging of the battery, the framework is broken into two hierarchical steps as follows:

Primary Management (PM) 20: In this step, primary decisions about power flow between generation resources and the energy storage unit will be made based the information from different generation assets, battery state of charge (SOC) and availability of the grid. This part of the management is shown as the PM 20 in FIG. 1A.

Secondary Management (SM): Whenever discharging battery or purchasing extra power from the grid is required, the decision will be made by the scenarios in order to extend the battery lifetime based on the final price of energy for the customers.

Varying depths of discharge and varying rates of discharge are considered as two primary determinants of battery life in this technique. Assuming the presence of environmental controls, temperature-based battery aging can be ignored. A feature of this technique is that it bases its analysis on battery performance and cycle life data provided by the manufacturer, supplemented by a limited amount of empirical test data. The present battery lifetime estimator also eliminates the need for an electrochemical model of the battery. The principle ideas of this technique are introduced in the following embodiments:

Embodiment 1

Each cell has a finite life. It will reach the end of its useful life when the cumulative effective ampere-hours of individual effective ampere-hours corresponding to a series of discharge events equals the rated charge life of the cell. The rated charge life is given as:

$$\Gamma_R = L_R \cdot D_R \cdot C_R \qquad (1)$$

Embodiment 2

The actual charge life of the cell is a function of the DoD. Therefore, the effective ampere-hour discharge in a given discharge event may be more or less than the actual discharge based on the actual DoD. In order to determine this functional relationship, the following function has been used to perform the best fit to the cell cycle life data vs. DoD $$L = u_2 \left(\frac{D_R}{D}\right)^{u_0} \cdot \exp\left(u_1\left(1 - \frac{D}{D_R}\right)\right) \quad (2)$$

Different methods can be applied to perform the curve fitting. Two different methods have been used in this study including particle swarm optimization (PSO) and non-linear least square (NLLS) method from MATLAB curve fitting toolbox. PSO, as a heuristic optimization technique, is able to achieve optimal solution in a small fraction of a second. Also, NLLS is a popular regression method.

Embodiment 3

The charge life of the cell, Γ, drops whenever the cell is discharged at a rate faster (higher discharge current) than the rated rate. Furthermore, the reduction in life will have a close functional relationship to the observed reduction in ampere-hour capacity with increasing discharge rateError! Reference source not found. This effect can be expressed fairly accurately by the following two-parameter function:

$$d_{eff} = \left(\frac{C_R}{C_A}\right)^{v_0} \cdot \exp\left(v_1\left(1 - \frac{C_R}{C_A}\right)\right) \cdot d_{act} \quad (3)$$

Since battery manufacturers typically conduct battery life testing at a single discharge rate, usually the rate for which the cell's rated capacity is given, enough data is not available to determine the parameters $v_0$ and $v_1$. Therefore, the effect of discharge rate will be estimated using a simplified form of Eq. (3) where $v_0$ is set equal to 1 and $v_1$ is set to 0:

$$d_{eff} = \left(\frac{C_R}{C_A}\right) \cdot d_{act} \quad (4)$$

In order to calculate $C_A$ related to each discharge event, 1-D cubic spline interpolation has been applied in this study. Using (2) and (4), the effects of DoD and discharge rate are combined simply by multiplying the factors as follows:

$$d_{eff} = \left(\frac{D_A}{D_R}\right)^{u_0} \cdot \exp\left(u_1\left(1 - \frac{D_A}{D_R}\right)\right) \cdot \left(\frac{C_R}{C_A}\right) \cdot d_{act} \quad (5)$$

Eq. (5) gives the effective discharge for a single discharge event. In order to estimate the lifetime of a battery which has been exposed to a series of discharge patterns, accumulative effective discharge is required. Finally, lifetime of the battery can be calculated as follows:

$$L_{time} = \frac{L_R \cdot D_R \cdot C_R}{\sum_{i=1}^{n} d_{eff,i}} \cdot T \quad (6)$$

The equations are used in the battery life estimator 30 of FIG. 1A.

Figure 1B:
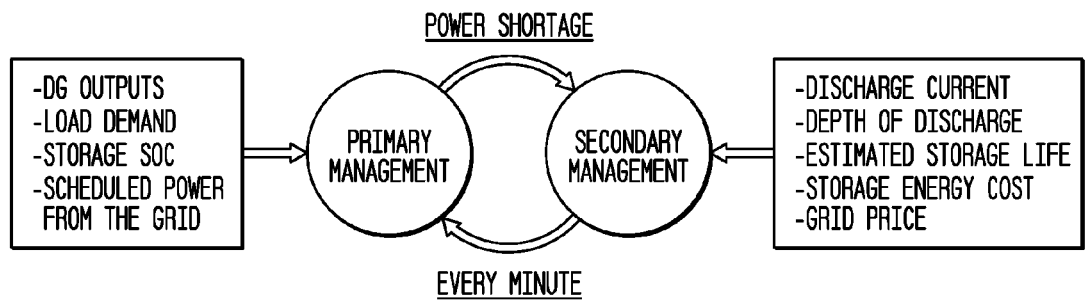
FIG. 1B shows an exemplary diagram with a general structure of the power management unit.

Turning now to FIG. 1B, an exemplary diagram illustrating a general structure of the power management unit is shown. A hierarchical (primary and secondary management units) approach makes it easy to prioritize different tasks of the management system based on their importance. The system includes a primary management system 102 that receives inputs 100 such as DG outputs, load demand, storage SOC, and scheduled power availability from the grid, among others. The primary management unit communicates on a frequent basis with the secondary management unit 106, which receives as inputs 104 the battery data including discharge current, depth of discharge, estimated storage life, storage energy cost and grid price, among others. The real-time power management framework enables cost-of-energy based discharge pattern for storage device to maximize its lifetime. The supervisory real-time power management framework guarantees the maximum possible battery lifetime based on the final price of energy, $/kWh.

In FIG. 1B, the real-time power management framework receives required data from different generation sources and battery state of charge and the discharge pattern of the battery at the time of management, then tries to estimate the battery lifetime and consequently calculates the cost of energy from the battery based on that. Finally, it attempts to share the desired power between the battery pack and the grid in order to minimize the cost of energy for the consumer which happens to be the best battery lifetime that is achievable in our system, based on the final energy cost. The management system is updated every minute with fresh data for future estimation.

Figure 2:
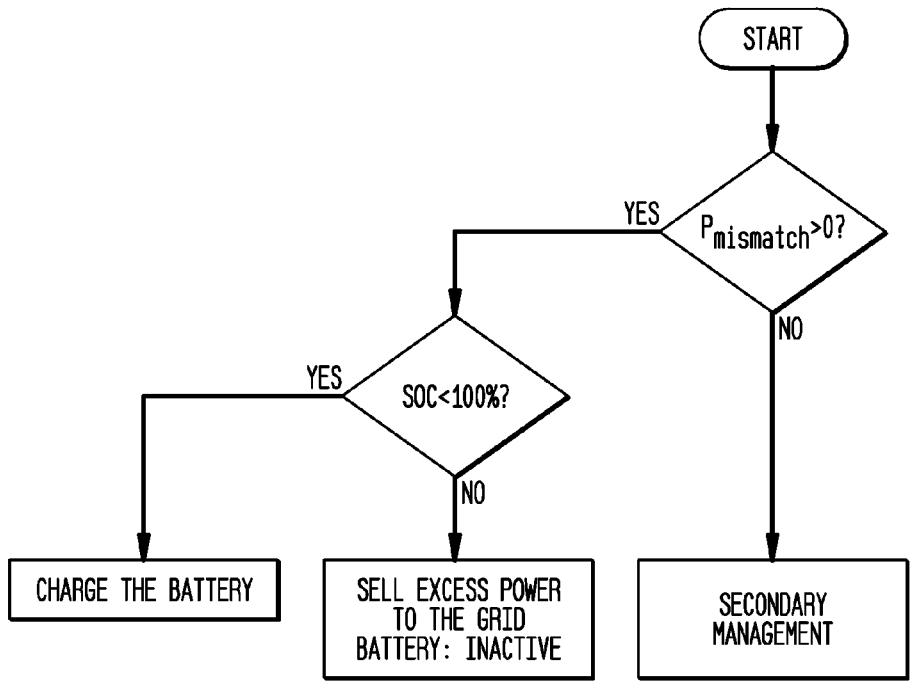
FIG. 2 shows an exemplary process executed by the primary management unit.
Figure 5:
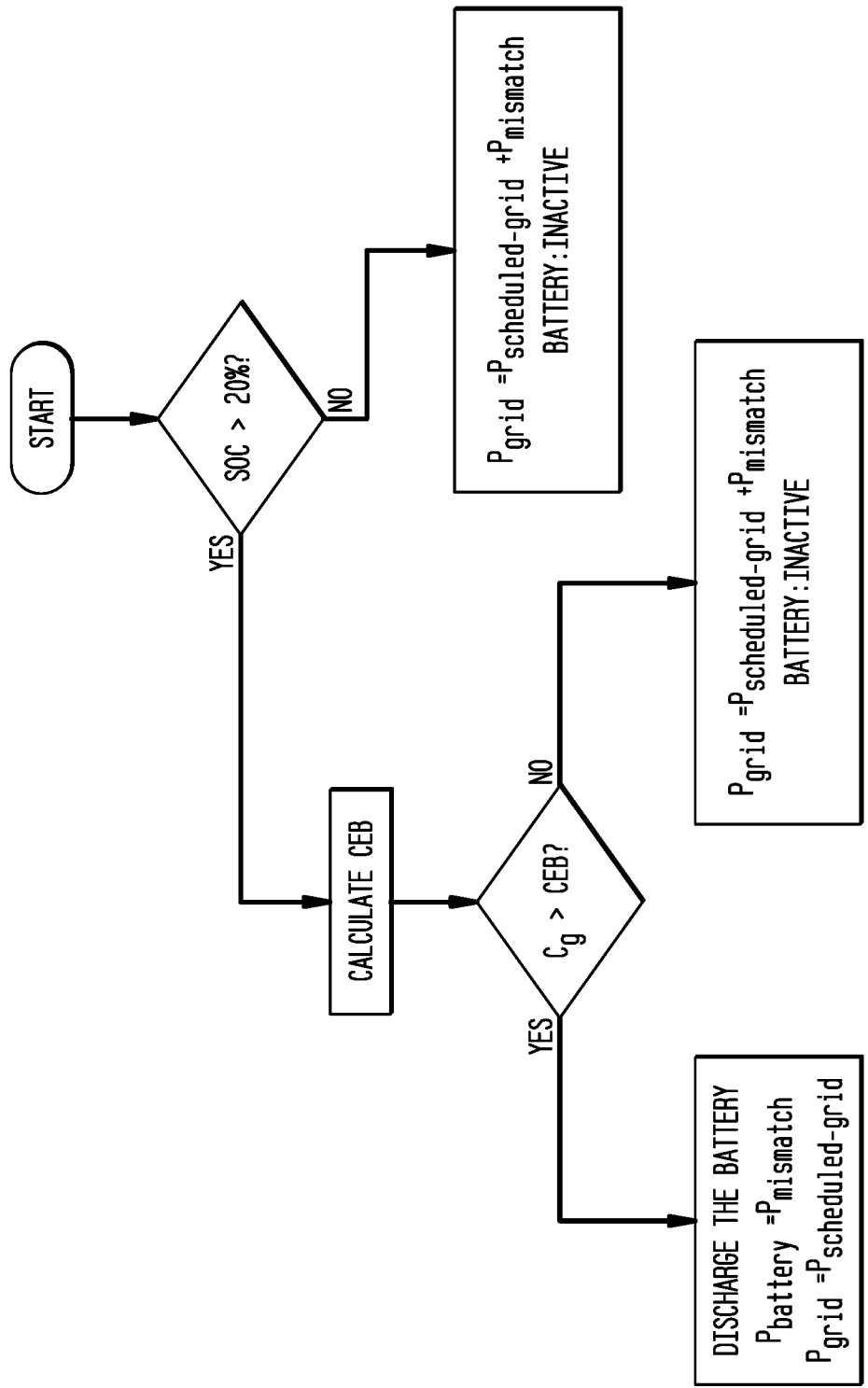
FIG. 5 shows an exemplary process in the secondary management system.

FIG. 2 shows an exemplary process executed by the primary management unit. In this process, the system determines if a power mismatch exists (202). If not, the process performs secondary management (FIG. 5). Alternatively, process determines if the SOC is less than full (206). If so, the process sells excess power to the grid and places the battery in an inactive mode (208). From 206, if the battery is less than full, the battery is charged (210).

In primary real-time power management, the power management unit acts as a master unit for the overall power management system. The system evaluates general status of power flow in a distribution network. The system collects and analyzes real-time data about the generation level and demand to calculate the mismatch power in the network as follows:

$$P_{mismatch} = P_{DG} + P_{scheduled-grid} - P_{load}$$

where $P_{mismatch}$ is the mismatch power between the generation and the demand, $P_{DG}$ is total distributed generation output powers, $P_{scheduled-grid}$ is the scheduled power from the grid, load is the demand in the distribution network. The system only charges the battery if excess generation is available in the network (mismatch power is positive. If sellback is allowed and the battery is fully charged, excess generation can also be exported to the grid.

Different methods can be used to perform curve fitting on battery characteristics which are provided by the battery manufacturer or obtained from experiments. Curve fitting can be used to define analytical functions describing the behavior of a battery to be used during the battery life estimation process. One embodiment uses article swarm optimization (PSO) as a heuristic optimization technique to achieve optimal solution in a small fraction of a second and is a curve fitting tool compatible with exponential nonlinear battery characteristics in terms of cycle lives versus depth of discharges. Therefore this technique is used instead of other conventional curve fitting tools such as non-linear least square (NLLS) method in battery life estimation applications.

Figure 3:
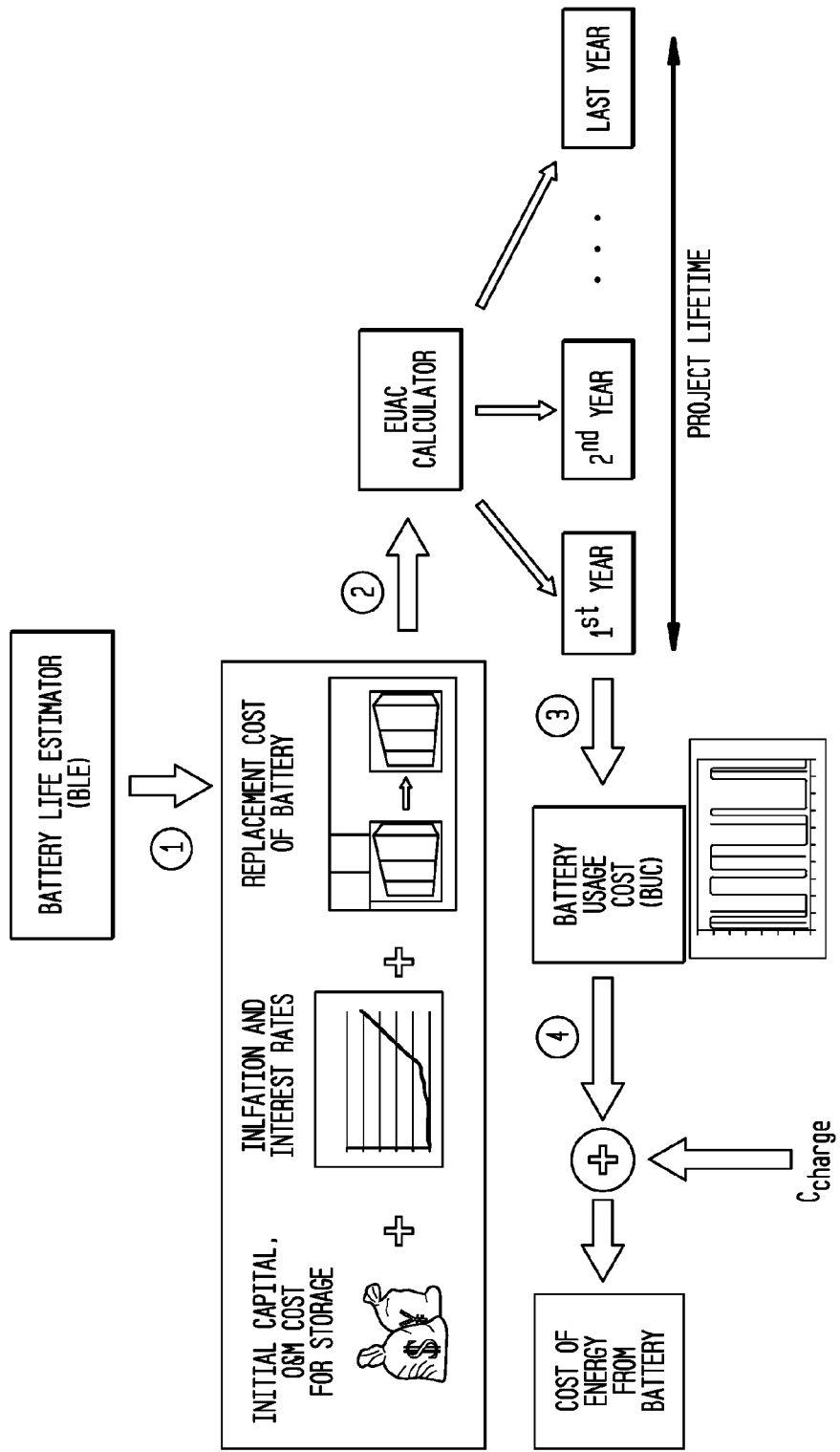
FIG. 3 shows an exemplary battery life estimator.

FIG. 3 shows an exemplary battery life estimator 310. Data such as initial capital, O&M cost for storage, inflation, interest rate, and replacement cost of battery is collected in block 312 and provided to an equivalent uniform annual cost (EUAC) model calculator 314 that determines annual costs over the project lifetime and sends the information to a battery usage cost (BUC) unit 316. The output of unit 31 is combined with the charging cost by adder 318 to arrive at the cost of energy from the battery in unit 320.

One embodiment generates an equivalent uniform annual cost (EUAC) model: FIG. 3 shows input parameters and steps to calculate cost of energy from a battery in the secondary management unit. The secondary power management unit first estimates corresponding discharge current and DOD of the battery if it is going to be used to meet the power shortage. These parameters are then used in the battery life estimator (BLE) unit to update the estimated life of the battery shown in step 1 in FIG. 3. Output of BLE unit determines the battery replacement cost during the useful lifetime of the project. Battery replacement cost along with other necessary parameters such as battery capital cost, battery O&M cost, nominal interest rate and inflation rate and useful project lifetime are passed to the equivalent uniform annual cost (EUAC) calculator block which calculates the annualized cost of battery. Battery usage cost is then calculated from the output of EUAC calculator block. Finally cost of energy from battery (CEB) is calculated by adding the charging cost of battery to the battery usage cost.

Next, the Cost of Energy from Battery (CEB) Calculation is detailed. The number of battery replacements over the lifetime of the project can be calculated from the estimated battery life. In this study, the following cost model is used to calculate the CEB. In one embodiment, the cost of charging the battery is zero is assumed to be free.

$$AC = RBC \times \{[CC + RC \times SFF(i, Y_{rep})] \times CRF(i, Y_{proj})\} + RBC \times O\&MC \times (1+f)^n \quad (7)$$

where, $$SFF(i, Y_{rep}) = \sum_{n=1}^{NO.rep} \frac{1}{(1+i)^{n \times Y_{rep}}} \quad (8)$$

$$CRF(i, Y_{proj}) = (i \times (1+i)^{Y_{proj}})/((1+i)^{Y_{proj}} - 1) \quad (9)$$

$$i = (i_{nom} - f)/(1+f) \quad (10)$$

The capital cost of battery is dependent on its application. For commercial building application in the range of 25-50 kWh, it is $4240/kW in average (the actual price varies from $2800 to $5600/kW). Since the capital cost includes cost of battery, power electronics, cost of installation, step-up transformer, smart-grid communication and controls, and grid interconnection to utility, the replacement cost is considered to be 60% of the capital cost in one implementation.

For O&MC, one exemplary value is equal to $50/kAh/year. Additionally, the nominal annual interest and inflation rates are assumed to be 3.5% and 1.5%, respectively. In order to compare the cost of electricity from battery with that from grid, the cost of battery is translated to $/kWh instead of $/year. Thus, the cost of electricity from battery is expressed as follows:

$$CEB = AC/(8760 \times RBC)[\$/kWh] \quad (11)$$

The system can perform Cost-based Energy storage dispatch: By comparing CEB with the grid price, the cheaper source of energy either from the battery or from the grid is detected and will be used to supply the power shortage in the network. Once a decision is made to discharge the battery, target discharge power can be set equal to the minimum of power shortage and maximum discharge power capability of the battery.

Figure 4:
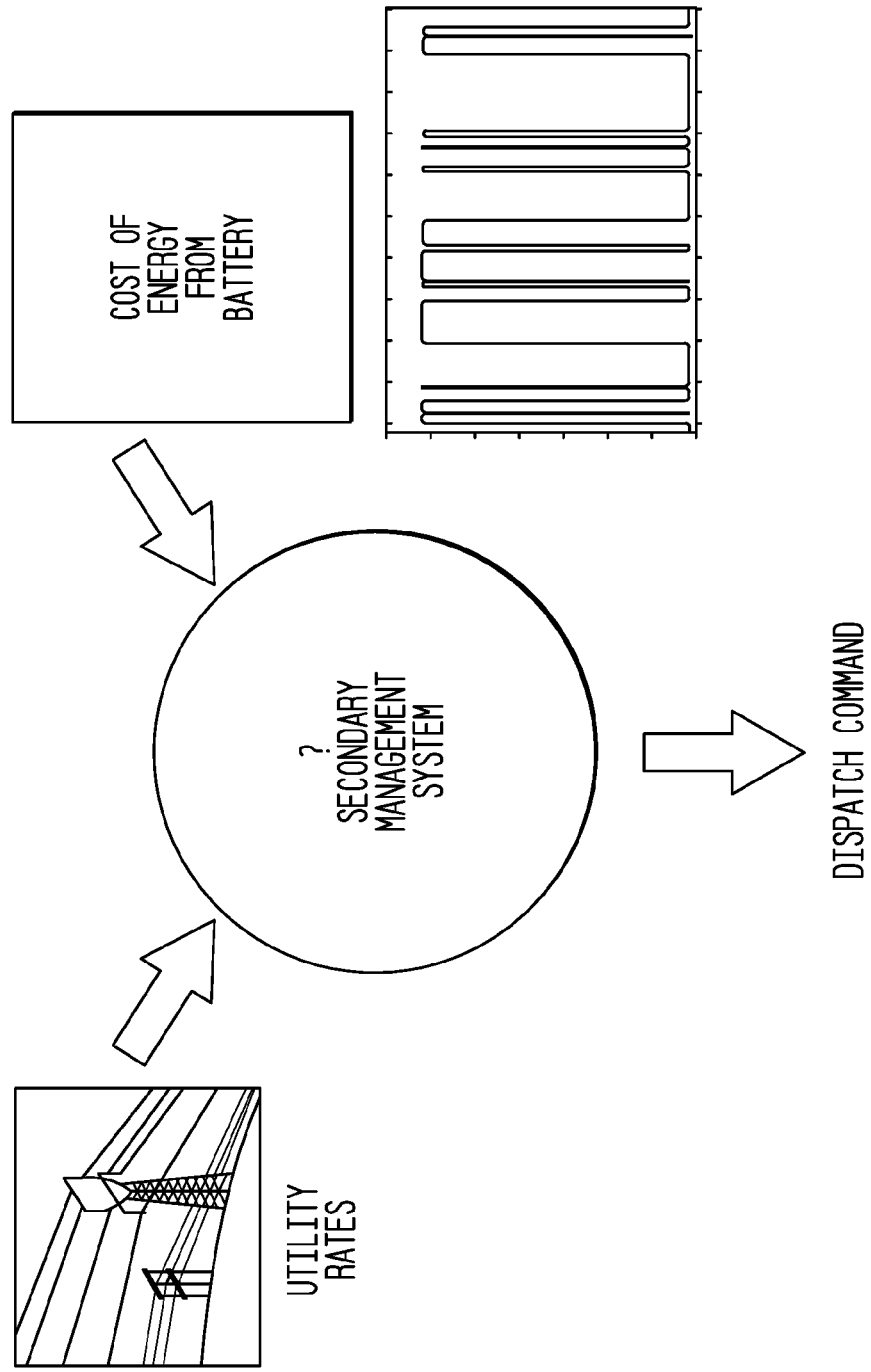
FIG. 4 shows an exemplary system with a secondary management system.

Decision making process in the secondary power management unit is visually presented in FIG. 4, which shows an exemplary system with a secondary management system 350. In this system, the secondary management system 350 receives utility rates 330 and the cost of energy from the battery CEB 320. The secondary management system 350 then dispatches commands to the battery system.

The real-time power management framework enables cost-of-energy based discharge pattern for storage device to maximize its lifetime. A top-level supervisory real-time power management framework has been developed in order to guarantee the maximum possible battery lifetime based on the final price of energy, $/kWh. The hierarchical (primary and secondary management units) approach makes it easy to prioritize different tasks of the management system based on their importance.

Different methods can be used to perform curve fitting on battery characteristics which are provided by the battery manufacturer or obtained from experiments. Curve fitting is necessary in order to define analytical functions describing the behavior of a battery to be used during the battery life estimation process.

One embodiment uses particle swarm optimization (PSO) as a heuristic optimization technique is able to achieve optimal solution in a small fraction of a second and is a curve fitting tool compatible with exponential nonlinear battery characteristics in terms of cycle lives versus depth of discharges. Therefore this technique is used instead of other conventional curve fitting tools such as non-linear least square (NLLS) method in battery life estimation applications.

FIG. 5 shows an exemplary process in the secondary management system 350. First, the system determines if the battery state SOC is greater than 20% (300). If not, the process sets grid power to $P_{grid} = P_{scheduled-grid} + P_{mismatch}$ (302). The mismatch power calculation is determined as follows: A primary power management system which collects and analyzes real-time data about the generation level and demand to calculate the mismatch power in the network as follows:

$$P_{mismatch} = P_{DG} + P_{scheduled-grid} - P_{load}$$

where $P_{mismatch}$ is the mismatch power between the generation and the demand, $P_{DG}$ is total distributed generation output powers, $P_{scheduled-grid}$ is the scheduled power from the grid, $P_{load}$ is the demand in the distribution network.

From 300, if the SOC is greater than 20%, the process determines CEB as discussed above (310) and then checks if Cg is greater than CEB (312). If not the process updates grid power as $P_{grid} = P_{scheduled-grid} + P_{mismatch}$ and places the battery in an inactive state (314). Alternatively, the battery is discharged (316).

Various implementations of the foregoing system are described next. The system supports intelligent power management system for energy storage in local distribution networks. The power management system operates based on unique characteristics of electric energy storage devices interconnected to utility distribution networks. The power management system focuses primarily on the life aspect of energy storage and improves lifetime of a storage unit by minimizing its operation and operation time. The system only charges/discharges the storage unit at specific time schedules. The system also limits the maximum operation time of a storage unit within each time interval (e.g. hour, day, month, . . . ). Lifetime of a storage unit is increased by indirectly by imposing constraints on its operational power. The system limits the minimum discharge power of a storage unit thus reduces its operational time. The system limits the maximum discharge power of a storage unit to less than its nominal value thus reduces the deteriorating impact of high power discharges on the battery lifetime. The system only discharges the storage unit if the utility connection is lost due to a grid failure thus reduces the storage unit operation time. The system only charges/discharges the storage unit if certain conditions about time and power in the network are met. The system only discharges the storage unit if both utility electric price (in $/kWh) and demand in the network (in kW) are above certain values thus reduces the utilization time of the storage unit.

One embodiment provides a closed-loop operation. In this embodiment, the power management system is equipped with direct measurement and/or estimation tools for energy storage performance and other parameters in the network. Output commands from the management system are updated in discrete time intervals based on the feedback signals from sensor/estimator modules. The system can be solely based on direct measurement of certain energy storage parameters. The power management system objective is to keep battery parameters within the pre-specified limits. The State of charge (SOC) (depth of discharge (DOD)) of a storage device measurement is continuously monitored SOC (DOD) to ensure it is within the recommended range. In case of any breach of SOC limits, the power management system halts the energy storage operation until necessary actions are taken by the user. The system continuously monitors temperature of a storage device to ensure it is within the recommended range. In case of any breach of temperature limits, the power management system halts the energy storage operation until necessary actions are taken by the user.

The system also provides State of health measurement (SOH. The system continuously monitors SOH of a storage device to ensure it is within the recommended range. In case of any breach of SOH limits, the power management system halts the energy storage operation until necessary actions are taken by the user. The system can be based on direct measurement as well as estimation of some parameters related to the energy storage unit. If the estimated operational conditions of the energy storage are out of recommended range, the management system will not operate the storage unit. The system also estimates discharge power of the storage unit in the next control time-step based on forecast of generation and demand levels in the network. If the estimated discharge power is out of recommended range, the management system will not operate the storage unit. Depth of discharge and discharge current of the storage unit in the next control time-step is estimated based on forecast of generation and demand levels in the network, current value of depth of discharge and battery voltage. If the estimated depth of discharge and/or discharge current is out of recommended range, the management system will not operate the storage unit. The system estimates the life of the storage unit at each control time-step and halts the energy storage operation if it is close to end of its life. In one embodiment, particle swarm optimization (PSO) can be used to find the most accurate life estimation. Non-heuristic methods can be used to find the most accurate life estimation. The system can be based on direct measurement as well as estimation of some parameters related to the energy storage unit. The management system regulates the future operational condition of the storage unit based on measured/estimated parameters.

Charging conditions of the storage unit can be controlled to optimize battery life. The system ensures the battery is charged at a slow rate to enhance the battery lifetime. The system regulates temperature of the storage unit. The system regulates discharging condition of the storage unit. The system accumulates all information related to the discharge history of a storage unit over time and makes future discharge decision based on accumulated information. The system evaluates each likely discharge event in the future individually and makes decision based on the impact of individual discharge events on the storage life. The system regulates discharge events of a storage unit to achieve a certain objective function in the network. The system only discharges the battery if the accumulated impact of the new discharge event and all previous discharge events result in a storage life of greater than or equal to a pre-specified number of years. The system regulates discharge events of a storage unit to minimize the cost of energy for the end-user. The system focuses primarily on reducing cost of consumed energy through the operation of energy storage units.

The system can handle secondary power management activation when needed. In case of any shortage in the local generation (negative mismatch power), the primary power management system triggers the secondary power management unit to remedy the shortage either by importing power from the grid or discharging the battery (or both). Input parameters to the primary power management unit include DG output powers, load demand, battery state of charge (SOC), and scheduled imported power from the grid (if any). The primary power management unit checks the status of the network every minute to achieve a reliable and efficient real-time control of the system. If necessary, secondary power management is then triggered to decide on how to remove the power shortage in the network. The secondary real-time power management decides on how to remove the power shortage in a network. The unit compares the cost of electricity from the battery and from the grid (or other sources) in real-time to identify energy source with the lowest cost. The system receives the grid price signal from the utility or other energy providers to be used for the purpose of cost comparison. Dynamic storage cost calculation is done—the secondary power management unit continuously updates the cost of energy from the energy storage unit based on historical data about the operation of the storage unit as well as its estimated operation in the future.

Storage devices are an integral part of any microgrid, technically and economically. Also, batteries are always known as the most expensive part of microgrids. The foregoing power management framework for a grid-tied microgrid with battery as storage device extends the battery life and reducing the cost of the energy for the consumer. The management framework to achieve maximum battery lifetime based on battery life estimation and the price of energy. In one embodiment for the grid-tied microgrids which include wind turbine and PV solar panels as generation assets and Li-Ion battery as storage device, the system is optimally designed using HOMER® with real wind speed, solar radiation, grid electricity price, and load demand data. A dynamic model of each component for the designed system is developed in MATLAB/Simulink®. Various power management strategies are then implemented on the dynamic model of the microgrid with actual data for a year.

Simulation results show that both goals have been achieved through the power management framework within three different scenarios.

Figure 6:
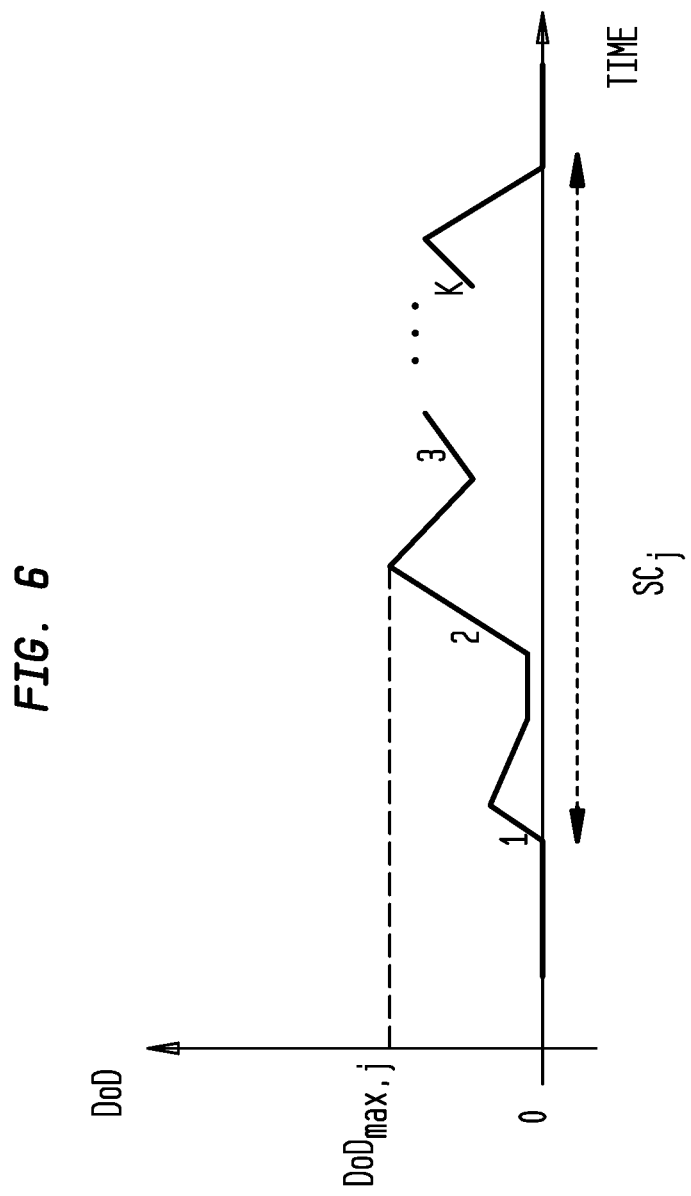
FIG. 6 shows a diagram of a supercycle modeling approach for estimating battery life in the presence of partial charge and discharge cycles, in accordance with the invention.

FIG. 6 shows a diagram of a sample supercycle ($SC_j$) modeling approach for estimating battery life in the presence of partial charge and discharge cycles, in accordance with the invention. Determining an effective ampere hour Ah throughput of a particular discharge event for a battery, the measured ampere-hour during a discharge event is multiplied by two weighting factors related to actual depth of discharge DoD and the relative magnitude of discharge current. These two factors weighting factor related to depth of discharge $L_1$ and weighting factor related to discharge current $L_2$ can be written as follows:

$$L_1 = \left(\frac{DoD}{DoD_{rated}}\right)^{u_0} e^{u_1\left(\frac{DoD}{DoD_{rated}} - 1\right)}, \text{ and} \quad (12)$$

$$L_2 = \frac{C_{rated}}{C}, \quad (13)$$

where parameters $u_0$ and $u_1$ can be calculated by applying a curve fitting procedure to cycle life versus DoD data available from the battery datasheet, $C_{rated}$ is rated battery Amphour capacity, C is actual Amp-hour capacity.

Turning again to FIG. 6, the sample supercycle ($SC_j$) shown includes k distinct discharge events 1, 2, . . . , k with duration $T_i, \ldots, T_k$, respectively. According to the supercycle definition, the effective ampere hours Ah related to these k discharge events are determined by using the following parameters:

$$D_oD_{SC_j} = D_oD_{max,j} \quad (14)$$

and $$I_{dischg,SC1} = \frac{I_{dischg,1}\Delta T_1 + \ldots + I_{dischg,k}\Delta T_k}{\Delta T_k + \ldots + \Delta T_k}, \quad (15)$$

where $I_{dischg}$ is discharge current. Discharge current and actual depth of discharge DoD obtained from these two relationships can then be used to calculate weighting factors in relationships (12) and (13). In this way, the weighting factor in (1) for all discharge events within a SC is calculated based on the maximum DoD during that SC. This means that partial charge cycles increase the amount of energy stored in a battery but do not decrease the impact of successive discharges on the battery life. The SC definition also ensures that each individual cycle starts from a full charge point which makes the general data from manufacturers more reliable for battery life estimation.

The estimated life of a battery after m supercycles can be estimated as follows:

$$LF_{batt} = \frac{\varphi_{rated}}{\sum_{j=1}^{m} L_{1,j} \times L_{2,j} \times I_{dischg,SC1} \times \left(\sum_{i=1}^{k} \Delta T_i\right)} \times T, \quad (16)$$

where $\varphi_{rated}$ is rated charge life of the battery.

It can be seen from FIG. 6 that a supercycle includes multiple periods of partial charges and discharges with different durations. If life estimation needs to be carried out at a fixed time-step ($\Delta t$) smaller than SC durations, the following scenarios might happen in the Lth time-step of a SC with p discharge steps:

Battery Charging or Standby:
In this case DoD and discharge current related to the SC do not change:

$$DoD_{SC_j}(L) = DoD_{SC_j}(L-1) \quad (17)$$

$$I_{dischg,SC_j}(L) = I_{dischg,SC_j}(L-1) \quad (18)$$

Battery Discharging:
In this case the SC parameters are updated as follows:

$$DoD_{SC_j}(L) = \max DoD_{SC_j}(L-1), DoD \quad (19)$$

$$I_{dischg,SC_j}(L) = \frac{I_{dischg,SC_j}(L-1)P + I_{dischg,L}}{P+1} \quad (20)$$

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. Additional information is provided in an appendix to the application entitled, "Additional Information". It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention.

What is claimed is:

1. A method for estimating battery life in power management of a microgrid with an energy storage device that includes charging and discharging modes, comprising:
   i) receiving power data from different generation sources, storage state of charge and a storage discharge pattern;
   ii) estimating a storage lifetime and determining cost of energy from the energy storage device which includes estimating battery life that considers a supercycle (SC) of a battery as a single discharge unit instead of treating each individual discharge period separately, the supercycle defines a time window between two consecutive full charges of a battery which allows assessing a worst case scenario impact of all partial cycles within a supercycle on the battery life; and
   iii) allocating desired power between the energy storage device and a power grid to minimize cost of energy through reduced grid power or feed-in-tariff while maximizing storage lifetime based on a final energy cost; wherein steps i)-iii) are implemented by a computer.

2. The method of claim 1, wherein the supercycle ($SC_j$) includes k distinct discharge events 1, 2, . . . , k with duration $T_i, \ldots, T_k$, respectively and effective ampere hours Ah related to these k discharge events are determined by using the parameters $D_oD_{SC_j} = D_oD_{max,j}$, where DoD is based on actual depth of discharge.

3. The method of claim 1, wherein the supercycle ($SC_j$) includes k distinct discharge events 1, 2, . . . , k with duration $T_i, \ldots, T_k$, respectively and effective ampere hours Ah related to these k discharge events are determined by using the parameters discharge $$I_{dischg,SC1} = \frac{I_{dischg,1}\Delta T_1 + \ldots + I_{dischg,k}\Delta T_k}{\Delta T_k + \ldots + \Delta T_k},$$

where $I_{dischg}$ is based on discharge current.

4. The method of claim 1, wherein the supercycle of the battery life includes weighting factors for all discharge events within a SC based on a maximum actual depth of dispatch discharge DoD during that SC.

5. The method of claim 1, wherein the estimated battery life after m supercycles can be estimated as follows:

$$LF_{batt} = \frac{\varphi_{rated}}{\sum_{j=1}^{m} L_{1,j} \times L_{2,j} \times I_{dischg,SC_1} \times \left(\sum_{i=1}^{k} \Delta T_i\right)} \times T,$$

where $\varphi_{rated}$ is rated charge of life of the battery $L_1$ and $L2$ are weighting factors, k and distinct discharge events 1, 2, ..., k with duration $T_i$, ..., $T_k$.

6. The method of claim 1, wherein the supercycle includes multiple periods of partial charges and discharges with different durations and if estimating battery life needs to be carried out at a fixed time-step ($\Delta t$) smaller than supercycle SC durations, then for battery charging or standby, in an Lth time-step of a supercycle SC, actual depth of discharge $DoD_{SC_j}$ and discharge current $I_{dischg,SC_j}$ related to the supercycle SC do not change and follow the relationships $DoD_{SC_j}(L)=DoD_{SC_j}(L-1)$ and $I_{dischg,SC_j}=I_{dischg,SC_j}(L-1)$.

7. The method of claim 1, wherein the supercycle includes multiple periods of partial charges and discharges with different durations and if estimating battery life needs to be carried out at a fixed time-step ($\Delta t$) smaller than supercycle SC durations, then for battery discharging, in an Lth time-step of a supercycle SC, actual depth of discharge $DoD_{SC_j}$ and discharge current $I_{dischg,SC_j}$ related to the supercycle SC parameters do not change and are updated as follows: $DoD_{SC_j}(L)=maxDoD_{SC_j}(L-1)$ and $$I_{dischg,SC_j}(L) = \frac{I_{dischg,SC_j}(L-1)P + I_{dischg,L}}{P+1}.$$

8. A system for estimating battery life in power management of a microgrid with an energy storage device that includes charging and discharging modes, comprising:
different generation sources, storage state of charge and a storage discharge pattern providing power data; and
a computer configured for estimating a storage lifetime and determining cost of energy from the energy storage device which includes estimating battery life that considers a supercycle (SC) of a battery as a single discharge unit instead of treating each individual discharge period separately, the supercycle defines a time window between two consecutive full charges of a battery which allows assessing a worst case scenario impact of all partial cycles within a supercycle on the battery life;
wherein the computer allocates desired power between the energy storage device and a power grid to minimize cost of energy through reduced grid power or feed-in-tariff while maximizing storage lifetime based on a final energy cost.

9. The system of claim 8, wherein the supercycle ($SC_j$) includes k distinct discharge events 1, 2, ..., k with duration $T_i$, ..., $T_k$, respectively and effective ampere hours Ah related to these k discharge events are determined by using the parameters $D_o D_{SC_j}=D_o D_{max,j}$, where DoD is based on actual depth of discharge.

10. The system of claim 8, wherein the supercycle ($SC_j$) includes k distinct discharge events 1, 2, ..., k with duration $T_i$, ..., $T_k$, respectively and effective ampere hours Ah related to these k discharge events are determined by using the parameters discharge $$I_{dischg,SC1} = \frac{I_{dischg,1}\Delta T_1 + \ldots + I_{dischg,k}\Delta T_k}{\Delta T_k + \ldots + \Delta T_k},$$

where $I_{dischg}$ is based on discharge current.

11. The system of claim 8, wherein the supercycle of the battery life includes weighting factors for all discharge events within a SC based on a maximum actual depth of dispatch discharge DoD during that SC.

12. The system of claim 8, wherein the estimated battery life after m supercycles can be estimated as follows:

$$LF_{batt} = \frac{\varphi_{rated}}{\sum_{j=1}^{m} L_{1,j} \times L_{2,j} \times I_{dischg,SC_1} \times \left(\sum_{i=1}^{k} \Delta T_i\right)} \times T,$$

where $\varphi_{rated}$ is rated charge of life of the battery $L_1$ and $L2$ are weighting factors, k and distinct discharge events 1, 2, ..., k with duration $T_i$, ..., $T_k$.

13. The system of claim 8, wherein the supercycle includes multiple periods of partial charges and discharges with different durations and if estimating battery life needs to be carried out at a fixed time-step ($\Delta t$) smaller than supercycle SC durations, then for battery charging or standby, in an Lth time-step of a superycle SC, actual depth of discharge $DoD_{SC_j}$, and discharge current $I_{dischg,SC_j}$ related to the supercycle SC do not change and follow the relationships $DoD_{SC_j}(L)=DoD_{SC_j}(L-1)$ and $I_{dischg,SC_j}(L)=I_{dischg,SC_j}(L-1)$.

14. The system of claim 8, wherein the supercycle includes multiple periods of partial charges and discharges with different durations and if estimating battery life needs to be carried out at a fixed time-step ($\Delta t$) smaller than supercycle SC durations, then for battery discharging, in an Lth time-step of a supercycle SC, actual depth of discharge $DoD_{SC_j}$ and discharge current $I_{dischg,SC_j}$ related to the supercycle SC parameters do not change and are updated as follows: $DoD_{SC_j}(L)=maxDoD_{SC_j}(L-1)$ and $$I_{dischg,SC_j}(L) = \frac{I_{dischg,SC_j}(L-1)P + I_{dischg,L}}{P+1}.$$

* * * * *